(12) United States Patent
Wang et al.

(10) Patent No.: US 11,127,684 B2
(45) Date of Patent: Sep. 21, 2021

(54) LOW-RESISTANCE INTERCONNECT STRUCTURES

(71) Applicant: Taiwan Semiconductor Manufacturing Co., Ltd., Hsinchu (TW)

(72) Inventors: Chao-Hsun Wang, Taoyuan County (TW); Wang-Jung Hsueh, Hsinchu (TW); Kuo-Yi Chao, Hsinchu (TW); Mei-Yun Wang, Hsin-Chu (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1 day.

(21) Appl. No.: 16/656,614

(22) Filed: Oct. 18, 2019

(65) Prior Publication Data

US 2021/0118801 A1    Apr. 22, 2021

(51) Int. Cl.
| | |
|---|---|
| H01L 23/48 | (2006.01) |
| H01L 23/535 | (2006.01) |
| H01L 29/423 | (2006.01) |
| H01L 29/417 | (2006.01) |
| H01L 21/768 | (2006.01) |
| H01L 23/532 | (2006.01) |
| H01L 21/74 | (2006.01) |
| H01L 23/528 | (2006.01) |

(52) U.S. Cl.
CPC .......... *H01L 23/535* (2013.01); *H01L 21/743* (2013.01); *H01L 21/76877* (2013.01); *H01L 21/76895* (2013.01); *H01L 23/528* (2013.01); *H01L 23/53228* (2013.01); *H01L 29/41725* (2013.01); *H01L 29/4232* (2013.01)

(58) Field of Classification Search
CPC . H01L 23/535; H01L 23/5286; H01L 23/528; H01L 23/5226; H01L 21/743; H01L 21/76877; H01L 29/41725
USPC ......................................... 257/758, 207–208
See application file for complete search history.

(56) References Cited

U.S. PATENT DOCUMENTS

| | | | |
|---|---|---|---|
| 6,717,267 B1 * | 4/2004 | Kunikiyo | H01L 23/552 257/758 |
| 7,365,432 B2 * | 4/2008 | Liaw | G11C 8/16 257/206 |
| 8,975,670 B2 * | 3/2015 | Or-Bach | H01L 27/0688 257/272 |
| 9,520,362 B2 | 12/2016 | Lin et al. | |
| 9,613,856 B1 | 4/2017 | Yang et al. | |
| 9,716,032 B2 | 7/2017 | Tang et al. | |
| 9,972,529 B2 | 5/2018 | Yang et al. | |

(Continued)

FOREIGN PATENT DOCUMENTS

| KR | 20160136715 | 11/2016 |
|---|---|---|
| KR | 20180112278 | 10/2018 |

*Primary Examiner* — Nitin Parekh
(74) *Attorney, Agent, or Firm* — Haynes and Boone, LLP

(57) ABSTRACT

A contact structure of a semiconductor device includes a gate contact in contact with a gate structure and extending through a first dielectric layer, a source/drain contact in contact with a source/drain feature and extending through the first dielectric layer, a common rail line in contact with the gate contact and the source/drain contact, and a power rail line in contact with the common rail line and electrically coupled to a ground of the semiconductor device.

20 Claims, 16 Drawing Sheets

(56) References Cited

U.S. PATENT DOCUMENTS

| | | | |
|---|---|---|---|
| 10,163,691 B2 | 12/2018 | Shih et al. | |
| 10,170,322 B1 | 1/2019 | Cheng et al. | |
| 10,347,726 B2* | 7/2019 | Bae | H01L 27/1104 |
| 10,607,938 B1* | 3/2020 | Rubin | H01L 21/823475 |
| 2008/0105947 A1* | 5/2008 | Kuzuhara | H01L 21/76838 |
| | | | 257/506 |
| 2013/0181297 A1* | 7/2013 | Liaw | H01L 27/0886 |
| | | | 257/390 |
| 2014/0110787 A1 | 4/2014 | Wen et al. | |
| 2016/0343708 A1 | 11/2016 | Park et al. | |
| 2017/0033048 A1* | 2/2017 | Kim | H01L 29/66636 |
| 2017/0133365 A1 | 5/2017 | Lim et al. | |
| 2018/0286957 A1 | 10/2018 | Bae et al. | |
| 2019/0006222 A1* | 1/2019 | Or-Bach | H01L 21/6835 |
| 2019/0067131 A1* | 2/2019 | Liaw | H01L 29/0847 |
| 2019/0067265 A1* | 2/2019 | Jeong | H01L 21/0274 |
| 2020/0411486 A1* | 12/2020 | Or-Bach | H01L 27/088 |

* cited by examiner

LOW-RESISTANCE INTERCONNECT STRUCTURES

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, contact vias may be used to electrically ground some gate contacts and source/drain contacts to the first metal layer of the interconnect structure, which may be referred to as the power rail. The use of gate contact vias or source/drain contact vias to electrically couple these gate contacts and the source/drain contacts to the first metal layer may increase resistance due to current crowding effect. In addition, when gate contact vias or source/drain contact vias are enlarged to have an oval or racetrack shape, critical dimension uniformity (CDU) and yield may be reduced. Accordingly, although existing interconnect structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
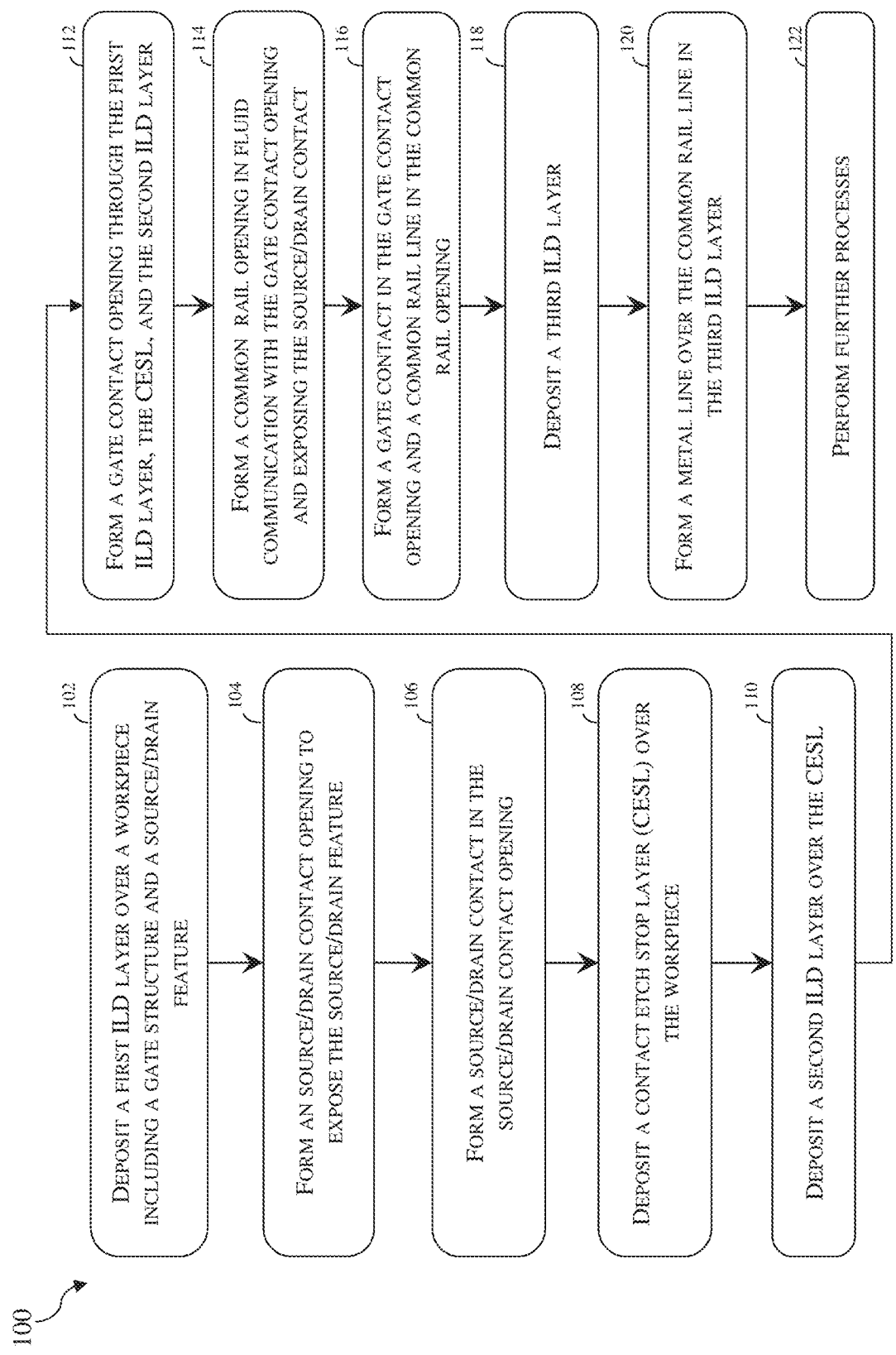
FIG. 1 is a flow chart of a method for fabricating a contact structure of a semiconductor device, according to various aspects of the present disclosure.

The present disclosure relates generally to integrated circuit (IC) devices, and more particularly, to contact structures of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, MEOL and BEOL processes are experiencing significant challenges. For example, due to design requirements, some MEOL features, including some gate contacts and source/drain contacts, are electrically grounded through a first metal layer (M0), which may be referred to a power rail or a power rail line. Conventionally, after both the gate contacts and the source/drain contacts have been formed, contact vias are formed through a dielectric layer to couple these to-be-grounded gate contacts and source/drain contacts to the first metal layer. Due to different materials of the first metal layer and the contact vias, interfacial resistance, and the smaller dimensions of the contact vias, the use of contact vias to couple the to-be-grounded contacts to the first metal layer may lead to current crowding effect and an increased resistance. As MEOL features are getting smaller, the contact vias in these conventional techniques are also getting smaller too, exacerbating the current crowding effect.

The present disclosure discloses a contact structure and a method that implement a common rail line that is electrically coupled to mergeable to-be-grounded MEOL features. The common rail may extend parallel to the first metal layer and largely increase the contact area with the first metal layer. The implementation of common rail lines may help distribute current evenly and alleviate the current crowding effect, resulting in reduction of resistance between the MEOL contacts and the first metal layer. Different embodiments may have different advantages, and no particular advantage is required of any embodiment.

FIG. 1 illustrates a flow chart of a method 100 for fabricating a contact structure of a semiconductor device according to various aspects of the present disclosure. FIGS. 2-10A are fragmentary cross-sectional views of a workpiece at various stages of fabrication of the method 100 in FIG. 1, according to various embodiments of method 100 of the present disclosure. Additional steps can be provided before, during, and after method 100, and some of the steps described can be moved, replaced, or eliminated for additional embodiments of method 100. Additional features can be added in the contact structure depicted in FIGS. 2-10A, and some of the features described below can be replaced, modified, or eliminated in other embodiments of the interconnect structure depicted in FIGS. 2-10A.

Figure 2:
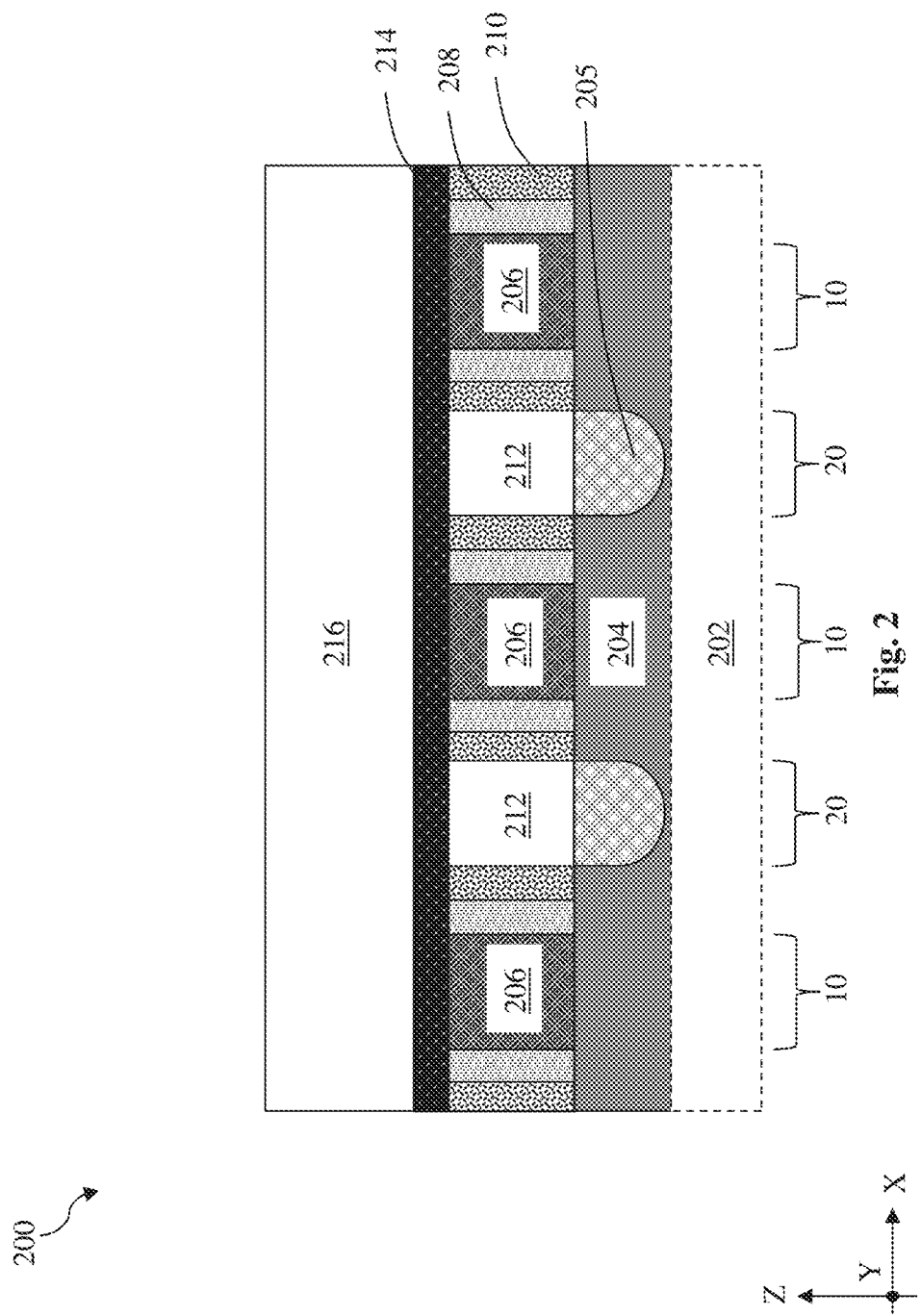
FIGS. 2-9 and 10A are fragmentary cross-sectional views of a workpiece along a first direction at various stages of fabrication of the method in FIG. 1, according to various aspects of the present disclosure.

Referring to FIGS. 1 and 2, the method 100 includes a block 102 where a first interlayer dielectric (ILD) layer 216 is deposited over a workpiece 200 that includes a gate structure 206 and a source/drain feature 205. Upon conclusion of the method 100, the workpiece 200 may be fabricated into a semiconductor device 200. In that sense, the workpiece 200 may also be referred to as a semiconductor device 200 in suitable context. The semiconductor device 200 can be included in a microprocessor, a memory, and/or other IC device. In some implementations, the semiconductor device 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs) or gate-all-around (GAA) transistors. FIG. 2 has been simplified for the sake of clarity to better understand the inventive concepts of the present disclosure. Additional features can be added in the semiconductor device 200, and some of the features described below can be replaced, modified, or eliminated in other embodiments of the semiconductor device 200.

The semiconductor device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-VI materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. For simplicity, the substrate 202 is not illustrated in FIGS. 3-10.

An isolation feature(s) (not shown) is formed over and/or in substrate 202 to isolate various regions, such as various device regions, of semiconductor device 200. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 202 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

Gate structures 206 are disposed over the substrate 202 and one or more of them interpose a source region 20 and a drain region 20, where a channel region 10 is defined between the source region 20 and the drain region 20. The gate structures 206 engage the channel region 10, such that current can flow between the source/drain regions 20 during operation. In some implementations, gate structures 206 are formed over a fin structure 204, such that gate structures 206 each wrap a portion of the fin structure 204. For example, gate structures 206 wrap channel regions 10 of the fin structure 204, thereby interposing source regions 20 and drain regions 20 of the fin structure 204. In some embodiments, gate structures 206 include metal gate (MG) stacks that are configured to achieve desired functionality according to design requirements of the semiconductor device 200. In some implementations, metal gate stacks include a gate dielectric and a gate electrode over the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Epitaxial source features 205 and epitaxial drain features 205 (referred to as source/drain features 205, for short) may be disposed in source/drain regions 20 of substrate 202. Gate structure 206 and source/drain features 205 each forms a portion of a transistor of the semiconductor device 200. Gate structure 206 and/or source/drain features 205 are thus alternatively referred to as device features. In some implementations, source/drain features 205 wrap source/drain regions 20 of a fin structure 204. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Source/drain features 205 may be doped with n-type dopants and/or p-type dopants. In some implementations, where the transistor is configured as an n-type device (for example, having an n-channel), source/drain features 205 can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), source/drain features 205 can be silicon-and-germanium-containing epitaxial layers doped with boron, other p-type dopant, or combinations thereof (for example, forming Si:Ge:B epitaxial layers). In some implementations, annealing processes are performed to activate dopants in source/drain features 205 of the semiconductor device 200.

As shown in FIG. 2, the workpiece 200 may also include a first gate spacer 208 disposed along sidewalls of the gate structures 206 and a second gate spacer 210 disposed along sidewalls of the first gate spacer 208. In some embodiments, the first gate spacer 208 and the second gate spacer 210 may include silicon oxide, silicon nitride, silicon oxynitride, silicon oxycarbide, silicon oxycarbonitride, a low-k (dielectric constant smaller than about 3.9) dielectric material, or a suitable dielectric material. The workpiece 200 also includes an ILD layer 212 disposed between gate structures 206 and over the source/drain features 205 as well as a gate top etch stop layer 214. In some embodiments, the ILD layer 212 and the first ILD layer 216 may have the same composition. In those embodiments, the ILD layer 212 and the first ILD layer 216 may include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. The gate top etch stop layer 214 includes a material different than the ILD layers 212 and the first ILD layer 216. In some embodiments, the gate top etch stop layer 214 may include silicon and nitrogen, such as silicon nitride or silicon oxynitride. The ILD layer 212, the gate top etch stop layer 214 and the first ILD layer 216 may be formed over the workpiece 200, for example, by a deposition process (such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low pressure CVD (LPCVD), atmospheric pressure CVD (APCVD), plating, other suitable methods, or combinations thereof). In some implementations, the ILD layer 212, the first ILD layer 216 and gate top etch stop layer 214 are formed by a flowable CVD (FCVD) process that includes, for example, depositing a flowable material (such as a liquid compound) over workpiece 200 and converting the flowable material to a solid material by a suitable technique, such as thermal annealing and/or ultraviolet radiation treating. Subsequent to the deposition of the material for the ILD layer 212, the first ILD layer 216 and gate top etch stop layer 214, a CMP process and/or other planarization process is performed, such that the ILD layer 212, the first ILD layer 216 and gate top etch stop layer 214 have substantially planar surfaces for enhancing formation of overlying layers.

Figure 3:
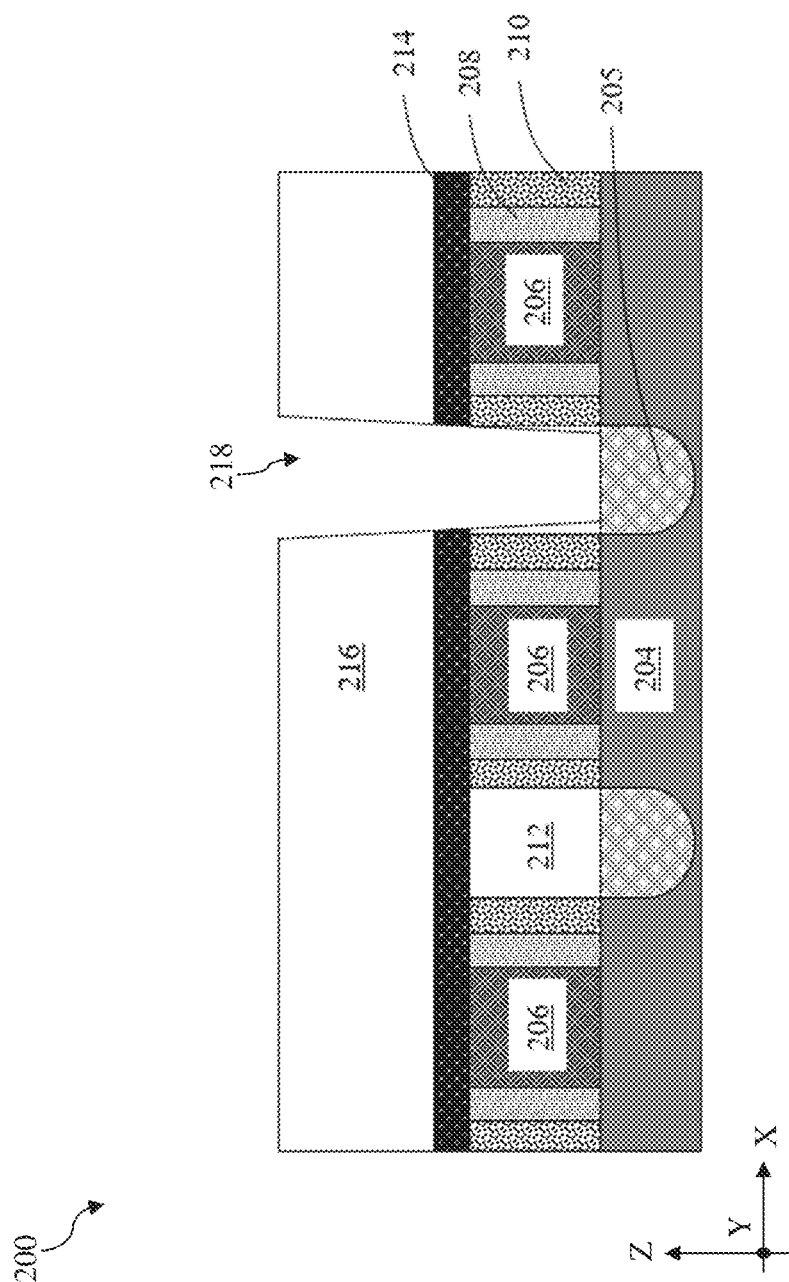

Referring now to FIGS. 1 and 3, the method 100 includes a block 104 where a source/drain contact opening 218 is formed to expose a portion of the source/drain feature 205. Forming the source/drain contact opening 218 through the first ILD layer 216, the gate top etch stop layer 214 and the ILD layer 212 may include use of lithography processes and/or etching processes. In some implementations, the lithography processes include forming a resist layer over the first ILD layer 216, exposing the resist layer to pattern radiation, and developing the exposed resist layer, thereby forming a patterned resist layer that can be used as a masking element for etching the source/drain contact opening 218 to expose at least a portion of the source/drain feature 205. The etching processes include dry etching processes, wet etching processes, other etching processes, or combinations thereof.

Figure 4:
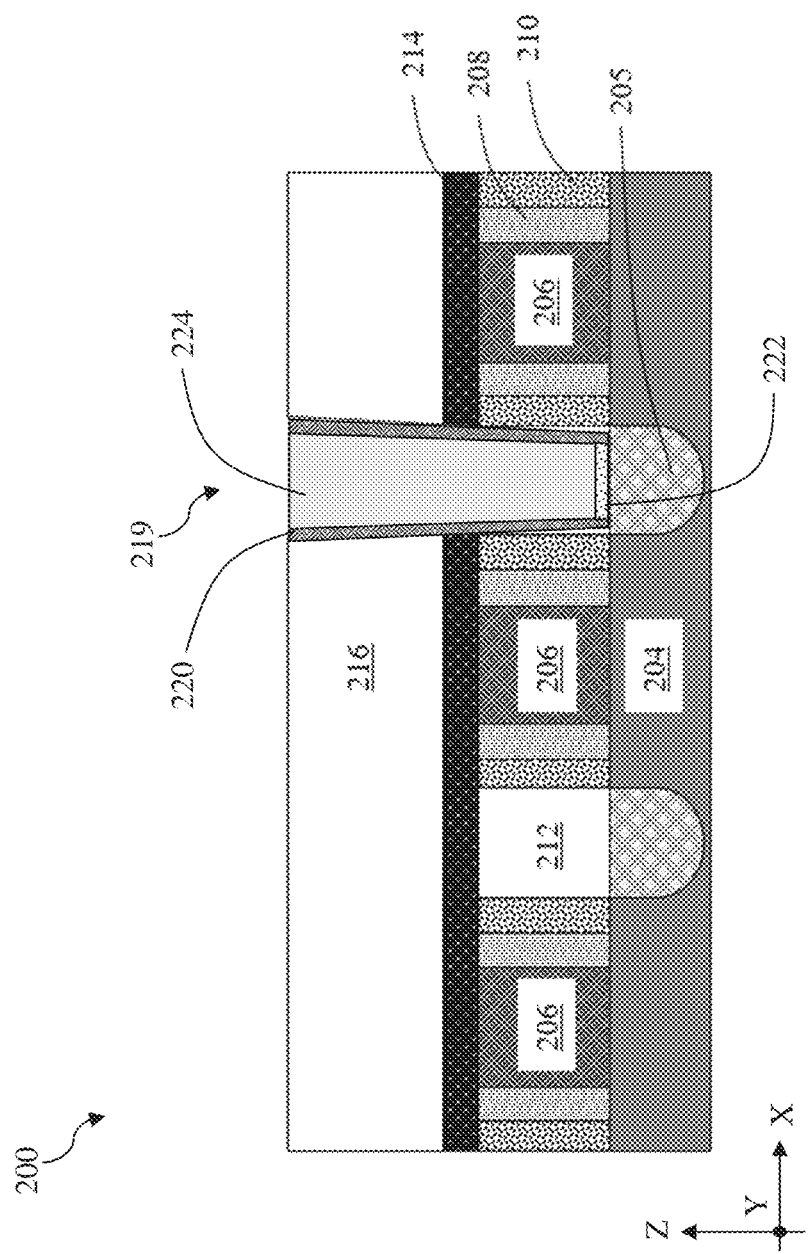

Referring now to FIGS. 1 and 4, the method 100 includes a block 106 where a source/drain contact 219 is formed in the source/drain contact opening 218. The source/drain contact 219 may include a silicide layer 222, a first barrier layer 220, and a metal fill layer 224. In some implementations, the silicide layer 222 is formed on the portion of the source/drain feature 205 exposed in the source/drain contact opening 218. In some implementations, the silicide layer 222 may be formed by depositing a metal layer over the exposed portion of the source/drain feature 205. The metal layer includes any material suitable for promoting silicide formation, such as nickel, platinum, palladium, vanadium, titanium, cobalt, tantalum, ytterbium, zirconium, other suitable metal, or combinations thereof. After deposition of the metal layer, the workpiece 200 is then annealed to cause constituents of source/drain feature 205 (for example, silicon and/or germanium) to react with the metal. The silicide layer 222 thus includes the metal in the metal layer and a constituent of the source/drain feature 205 (for example, silicon and/or germanium). In some implementations, the silicide layer 222 may include nickel silicide, titanium silicide, or cobalt silicide. Any un-reacted metal, such as remaining portions of the metal layer, is selectively removed by any suitable process, such as an etching process. In some embodiments, the first barrier layer 220 may be formed of tantalum, tantalum nitride, tantalum carbide, titanium, titanium nitride, titanium carbide, and other suitable material that can block oxygen diffusion or metal diffusion into neighboring dielectric layers. The first barrier layer 220 may be deposited using atomic layer deposition (ALD), chemical vapor deposition (CVD), or electroless deposition (ELD) and may be formed to a thickness between about 0.5 nm and about 5 nm. The metal fill layer 224 may be formed of any suitable conductive material, such as tungsten, nickel, tantalum, titanium, aluminum, copper, cobalt, tantalum nitride, titanium nitride, ruthenium, and/or other suitable conductive materials. In one example, the metal fill layer 224 is formed of tungsten. The metal fill layer 224 may be deposited using physical vapor deposition (PVD), CVD, ALD, electroplating, ELD, or other suitable deposition process, or combinations thereof. While not shown, a liner may be formed between the first barrier layer 220 and the metal fill layer 224 to promote adhesion of the metal fill layer 224 to the first barrier layer 220. In some instances, the liner may include cobalt, cobalt nitride, cobalt carbide, or other suitable metal, metal nitride, or metal carbide. The liner may be deposited using ALD, CVD, ELD, or PVD and may be formed to a thickness between about 0.5 nm and 3 nm. Thereafter, any excess material(s) can be removed by a planarization process, such as a CMP process, thereby planarizing top surfaces of the first ILD layer 216, the first barrier layer 220, the liner (if present), and the metal fill layer 224.

Figure 5:
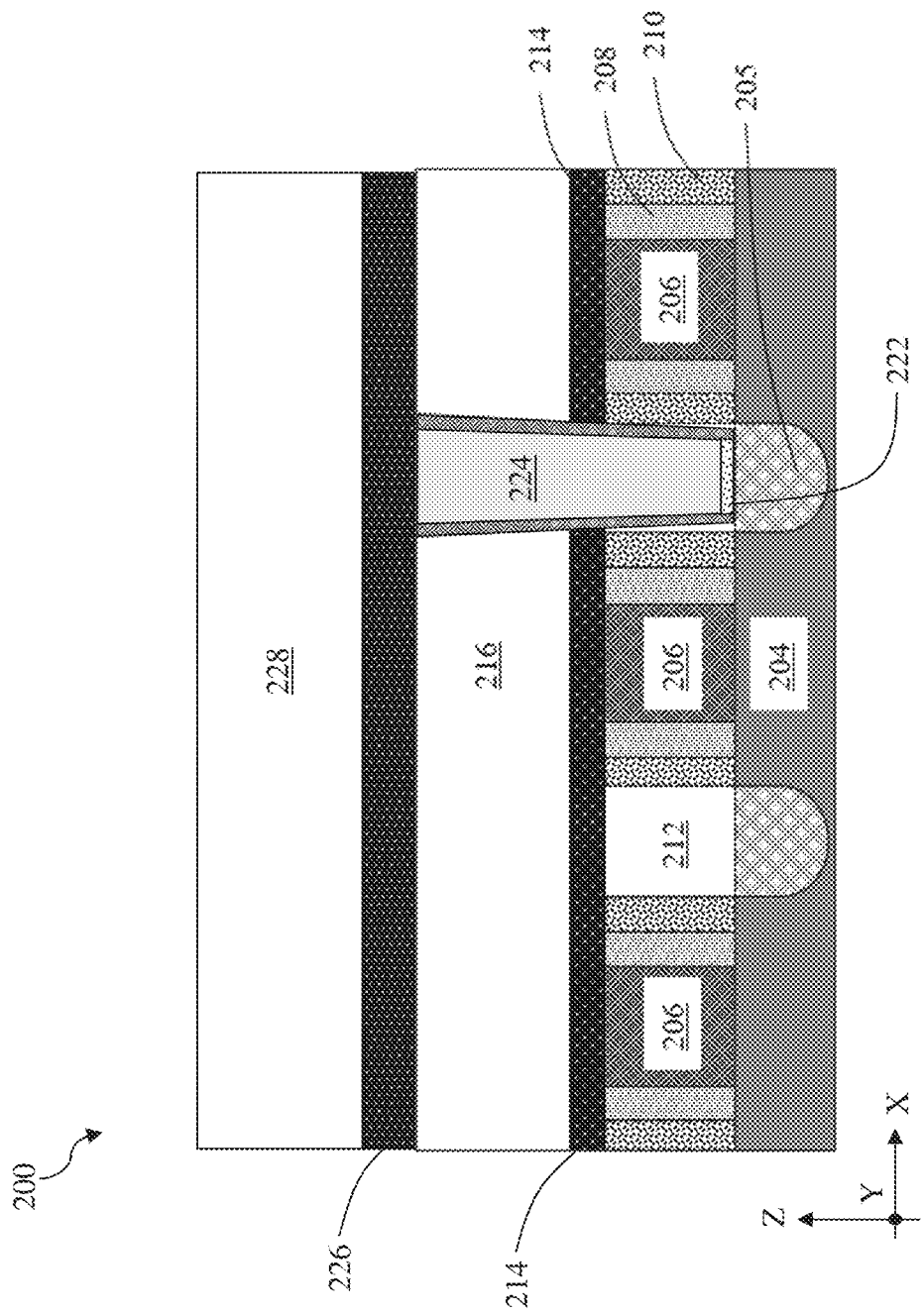

Referring now to FIGS. 1 and 5, the method 100 includes a block 108 where a contact etch stop layer (CESL) 226 is deposited over the workpiece 200. In some embodiments, the CESL 226 may include a material different than the first ILD layer 216. In some embodiments, the CESL 226 may include silicon and nitrogen, such as silicon nitride or silicon oxynitride. In some implementations, the CESL 226 may be formed over the workpiece 200, for example, by a deposition process (such as CVD, PVD, ALD, HDPCVD, MOCVD, RPCVD, PECVD, LPCVD, APCVD, plating, other suitable methods, or combinations thereof). In some other implementations, the CESL 226 may be formed by an FCVD process that includes, for example, depositing a flowable material (such as a liquid compound) over workpiece 200 and converting the flowable material to a solid material by a suitable technique, such as thermal annealing and/or ultraviolet radiation treating.

Referring still to FIGS. 1 and 5, the method 100 includes a block 110 where a second ILD layer 228 is deposited over the CESL 226. The second ILD layer 228 may include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, the second ILD layer 228 may be formed over the workpiece 200, for example, by a deposition process (such as CVD, PVD, ALD, HDPCVD, MOCVD, RPCVD, PECVD, LPCVD, APCVD, plating, other suitable methods, or combinations thereof). In some other implementations, the second ILD layer 228 may be formed by an FCVD process that includes, for example, depositing a flowable material (such as a liquid compound) over workpiece 200 and converting the flowable material to a solid material by a suitable technique, such as thermal annealing and/or ultraviolet radiation treating.

Figure 6:
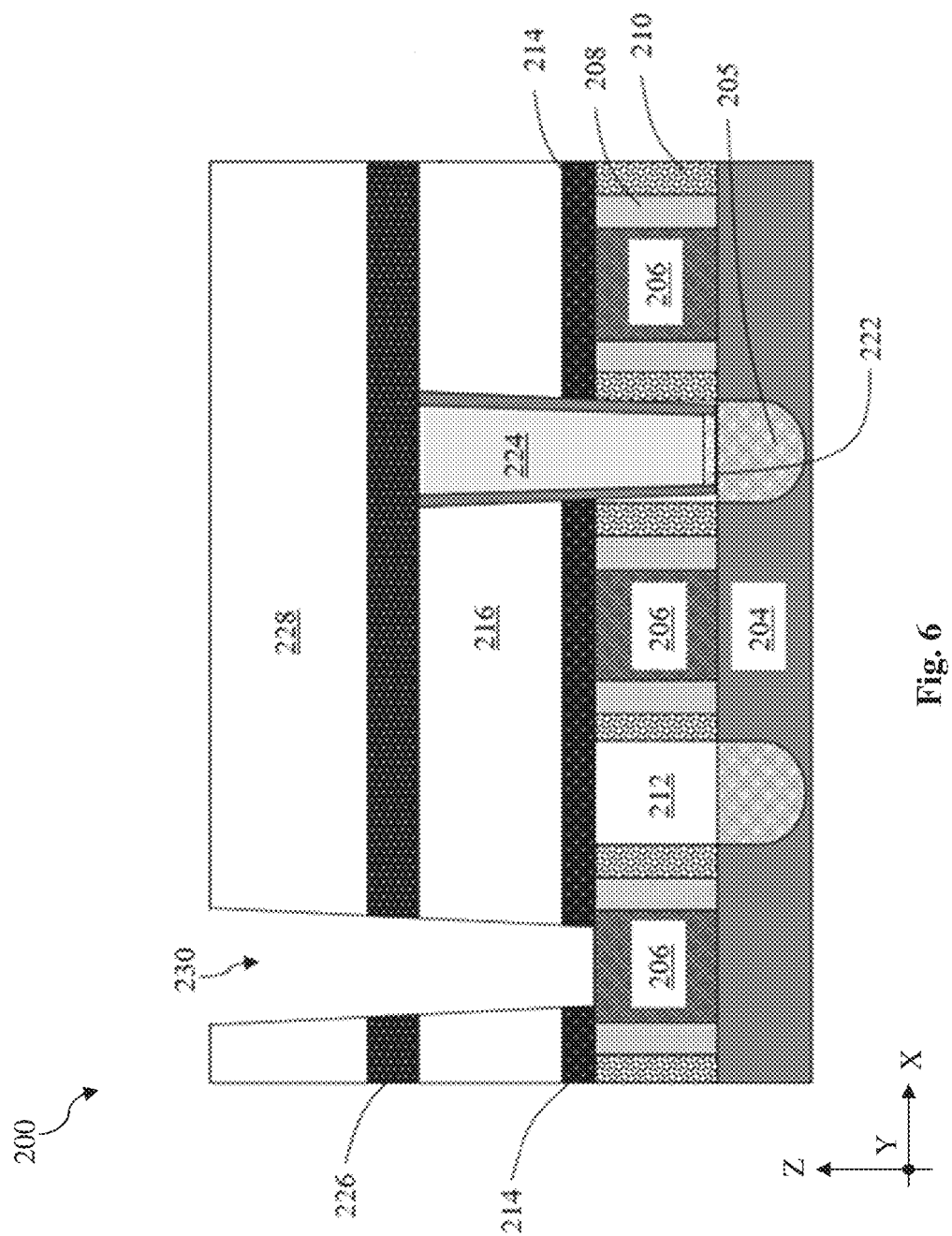

Referring now to FIGS. 1 and 6, the method 100 includes a block 112 where a gate contact opening 230 is formed through the second ILD layer 228, the CESL 226, the first ILD layer 216, the gate top etch stop layer 214. Forming the gate contact opening 230 through the second ILD layer 228, the CESL 226, the first ILD layer 216, the gate top etch stop layer 214 may include use of lithography processes and/or etching processes. In some implementations, the lithography processes include forming a resist layer over the second ILD layer 228, exposing the resist layer to pattern radiation, and developing the exposed resist layer, thereby forming a patterned resist layer that can be used as a masking element for etching the gate contact opening 230 to expose at least a portion of the gate structure 206. The etching processes include dry etching processes, wet etching processes, other etching processes, or combinations thereof.

Figure 7:
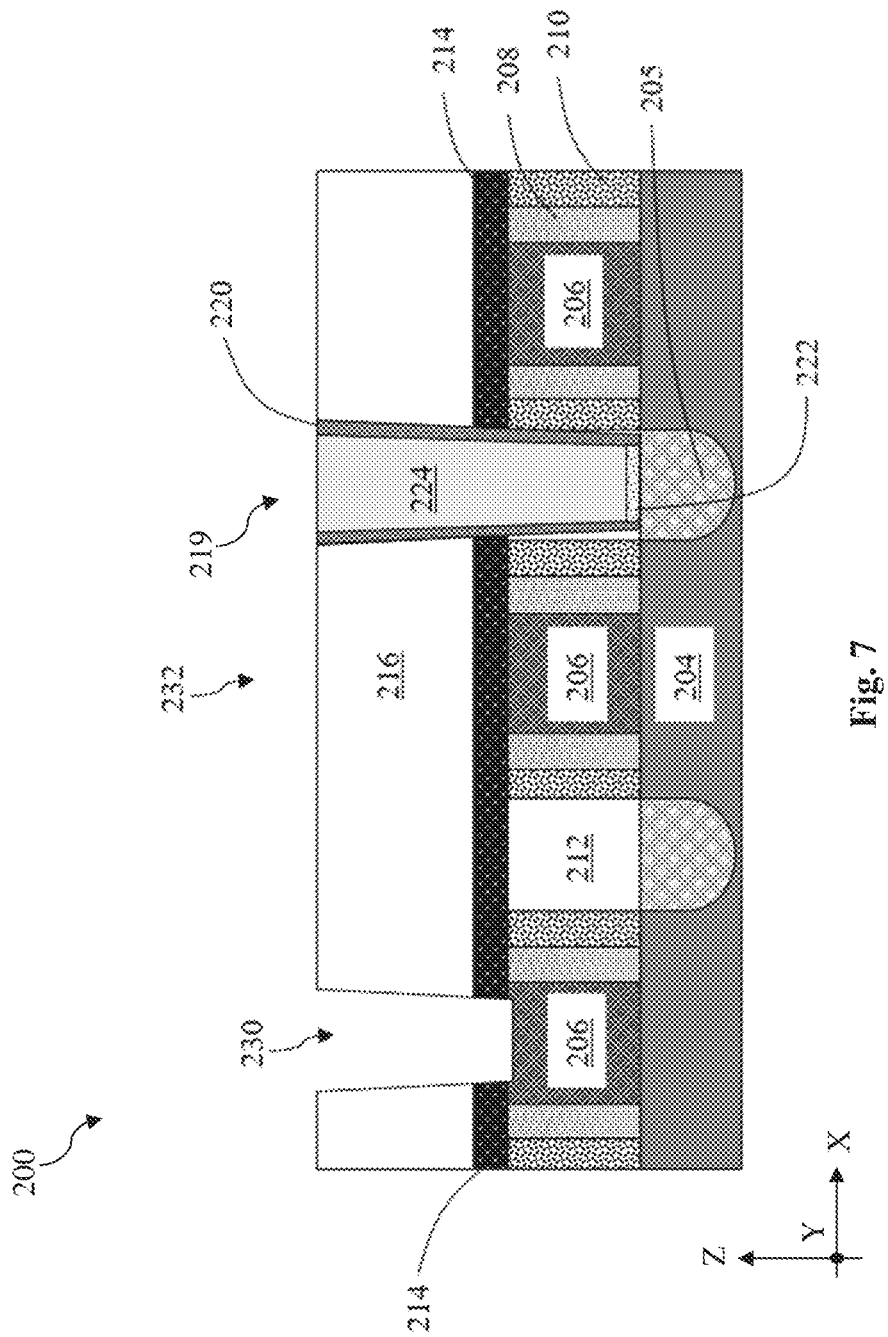

Referring now to FIGS. 1 and 7, the method 100 includes a block 114 where a common rail opening 232 in fluid communication with the gate contact opening 230 and exposing the source/drain contact 219 is formed. The common rail opening 232 is formed through the CESL 226 and the second ILD layer 228 and once formed, sidewalls of the common rail opening 232 are surrounded and lined by the CESL 226 and the second ILD layer 228. It is noted that while the portion of the CESL 226 and the second ILD layer 228 in the FIG. 7 are removed to form the common rail opening 232, the portion of the CESL 226 and the second ILD layer 228 around the common rail opening 232 is still present. As is shown in FIG. 7, the common rail opening 232 is in fluid communication with the gate contact opening 230 and a top surface of the source/drain contact 219 is exposed. In some implementations, forming the common rail opening 232 through the second ILD layer 228 and the CESL 226 may include use of lithography processes and/or etching processes. In some implementations, the lithography processes include forming a resist layer over the second ILD layer 228, exposing the resist layer to pattern radiation, and developing the exposed resist layer, thereby forming a patterned resist layer that can be used as a masking element for etching the common rail opening 232. The etching processes include dry etching processes, wet etching processes, other etching processes, or combinations thereof. The etching of the common rail opening 232 is timed to stop at around a bottom surface of the CESL 226.

Figure 8:
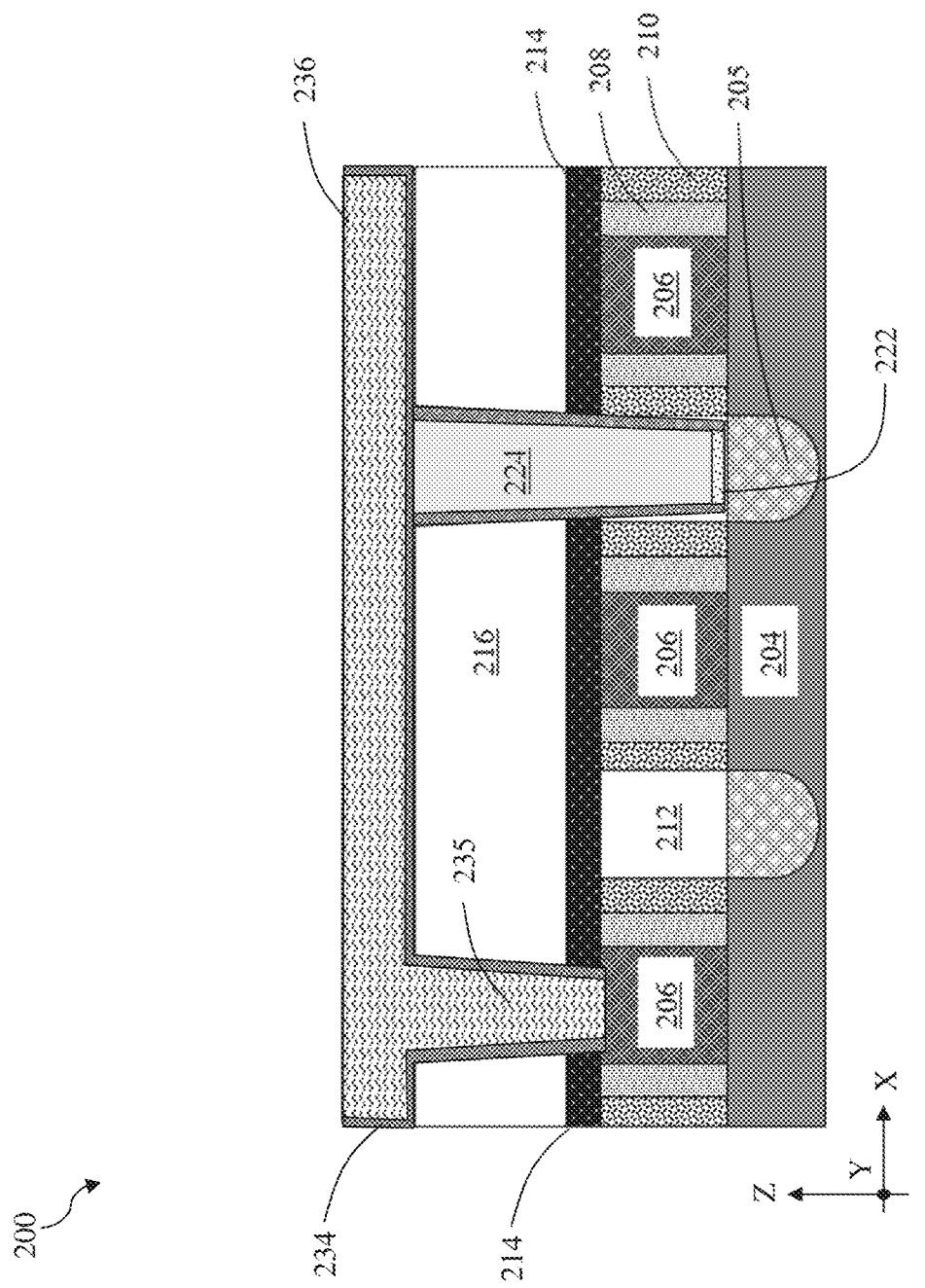

Referring to FIGS. 1 and 8, the method 100 includes a block 116 where a gate contact 235 and a common rail line 236 are formed in the gate contact opening 230 and the common rail opening 232. In some embodiments, at block 116, a barrier layer 234 is conformally deposited within the gate contact opening 230 and the common rail opening 232 to cover sidewalls of the gate contact opening 230 and the common rail opening 232. The barrier layer 234 may be formed of tantalum, tantalum nitride, tantalum carbide, titanium, titanium nitride, titanium carbide, and other suitable material that can block oxygen diffusion or metal diffusion into neighboring dielectric layers. The barrier layer 234 may be deposited using ALD, CVD, or ELD. In embodiments shown in FIG. 8, an anisotropic etch back process is performed to remove the portion of the barrier layer 234 on the gate structure 206 and reduce contact resistance. After the barrier layer 234 is formed, a metal fill material, such as tungsten, nickel, tantalum, titanium, aluminum, copper, cobalt, tantalum nitride, titanium nitride, ruthenium, and/or other suitable conductive materials, may be deposited into the gate contact opening 230 and the common rail opening 232 to form the gate contact 235 and the common rail line 236. That is, the gate contact 235 and the common rail line 236 may be a one-piece conductive body and may have a uniform composition throughout. In one example, the gate contact 235 and the common rail line 236 are formed of tungsten.

In some embodiments, to prevent imperfection or void in the gate contact 235, the formation of the gate contact 235 and the common rail line 236 may be carried out in a two-stage process. In the first stage of the two-stage process, the gate contact 235 may be formed in a bottom-up fashion using CVD or ALD. For example, a precursor that has a strong affinity to the gate structure 206 but a weak affinity to the barrier layer 234 may be used. Such a precursor may selectively attach to the gate structure 206 exposed in the gate contact opening 230 while exposed surfaces of the CESL 226 and the second ILD layer 228 are substantially free of the precursor. The precursor attached to the exposed surface of the gate structure 206 may then be caused to react with a reactant gas to form a conductive metal layer of the gate contact 235. After the gate contact 235 is substantially deposited to have a top surface level with the barrier layer 234 on the bottom surface of the common rail opening 232, the second stage of the two-stage process may ensue to form the common rail line 236. In some implementations, the second stage of the two-stage process may include CVD, ALD or a suitable deposition method. Different from the first stage of the two-stage process, the second stage does not deposit the metal fill material in a bottom-up fashion.

In some embodiments, the formation of the gate contact 235 and the common rail line 236 may be performed with assistance of a seed layer. In some implementations, the seed layer may be a thin metal or metal alloy layer. For example, the seed layer may include palladium (Pd), gold (Au), silver (Ag), aluminum (Al), niobium (Nb), chromium (Cr), boron (B), titanium (Ti), indium (In), manganese (Mn), or combinations thereof. The seed layer may be deposited over the common rail opening 230 and the gate contact opening 232 using physical vapor deposition (PVD), CVD, ALD, or electroless plating. After the seed layer is deposited in the common rail opening 230 and the gate contact opening 232, a metal fill material, such as tungsten, nickel, tantalum, titanium, aluminum, copper, cobalt, tantalum nitride, titanium nitride, ruthenium, and/or other suitable conductive materials, may be deposited by electroplating or electroless plating into the gate contact opening 230 and the common rail opening 232 to form the gate contact 235 and the common rail line 236.

Figure 9:
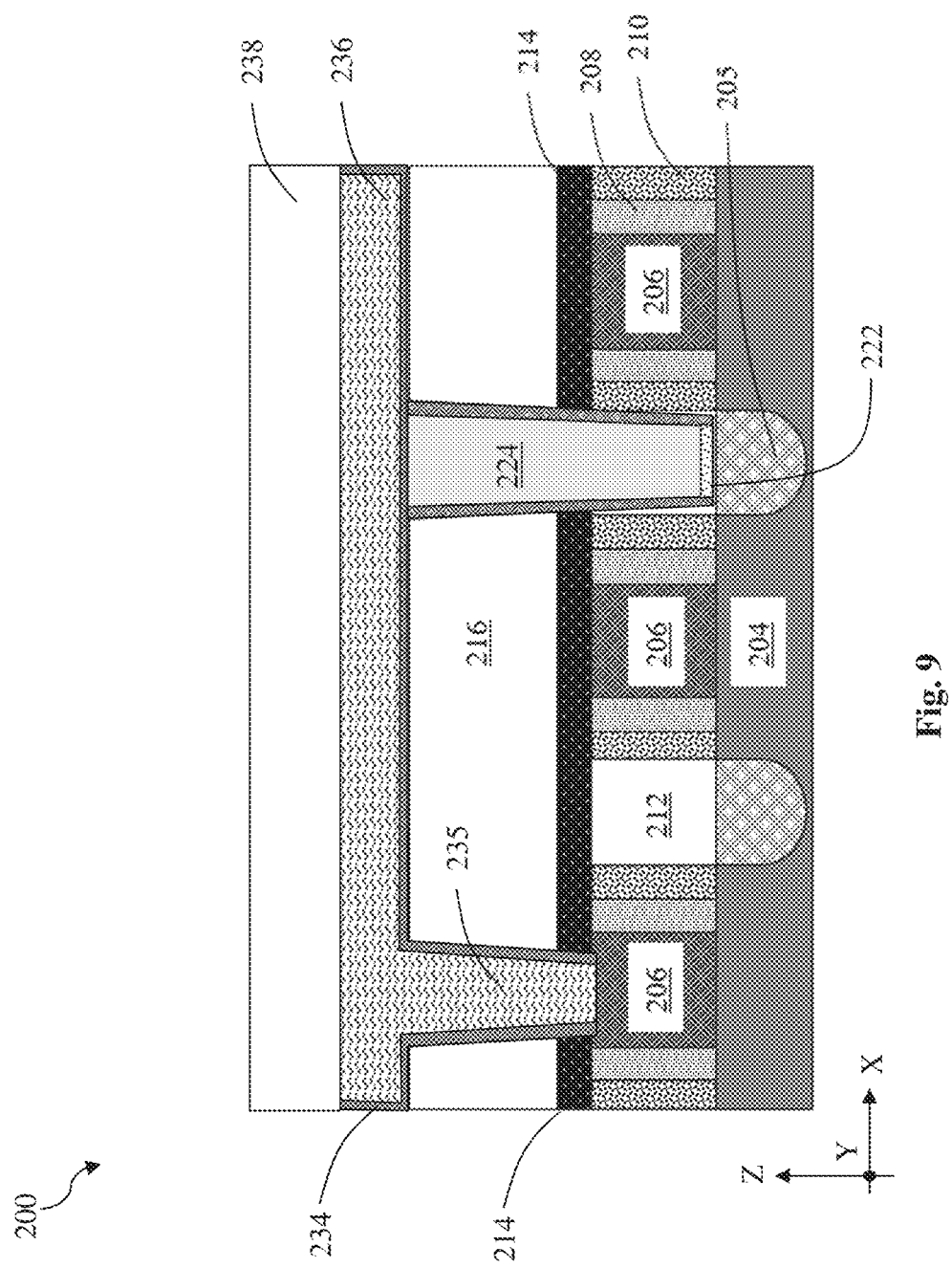

Referring to FIGS. 1 and 9, the method 100 includes a block 118 where a third ILD layer 238 is deposited over the workpiece 200. In some embodiments, the third ILD layer 238 may include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. The third ILD layer 238 may be formed over the workpiece 200, for example, by a deposition process (such as CVD, PVD, ALD, HDPCVD, MOCVD, RPCVD, PECVD, LPCVD, APCVD, plating, other suitable methods, or combinations thereof). In some implementations, the third ILD layer 238 may be formed by an FCVD process that includes, for example, depositing a flowable material (such as a liquid compound) over workpiece 200, including over the common rail line 236 and the barrier layer 234 and converting the flowable material to a solid material by a suitable technique, such as thermal annealing and/or ultraviolet radiation treating. Subsequent to the deposition of the material for the third ILD layer 238, a CMP process and/or other planarization process is performed, such that the third ILD layer 238 has a substantially planar surface for enhancing formation of overlying layers.

Figure 10A:
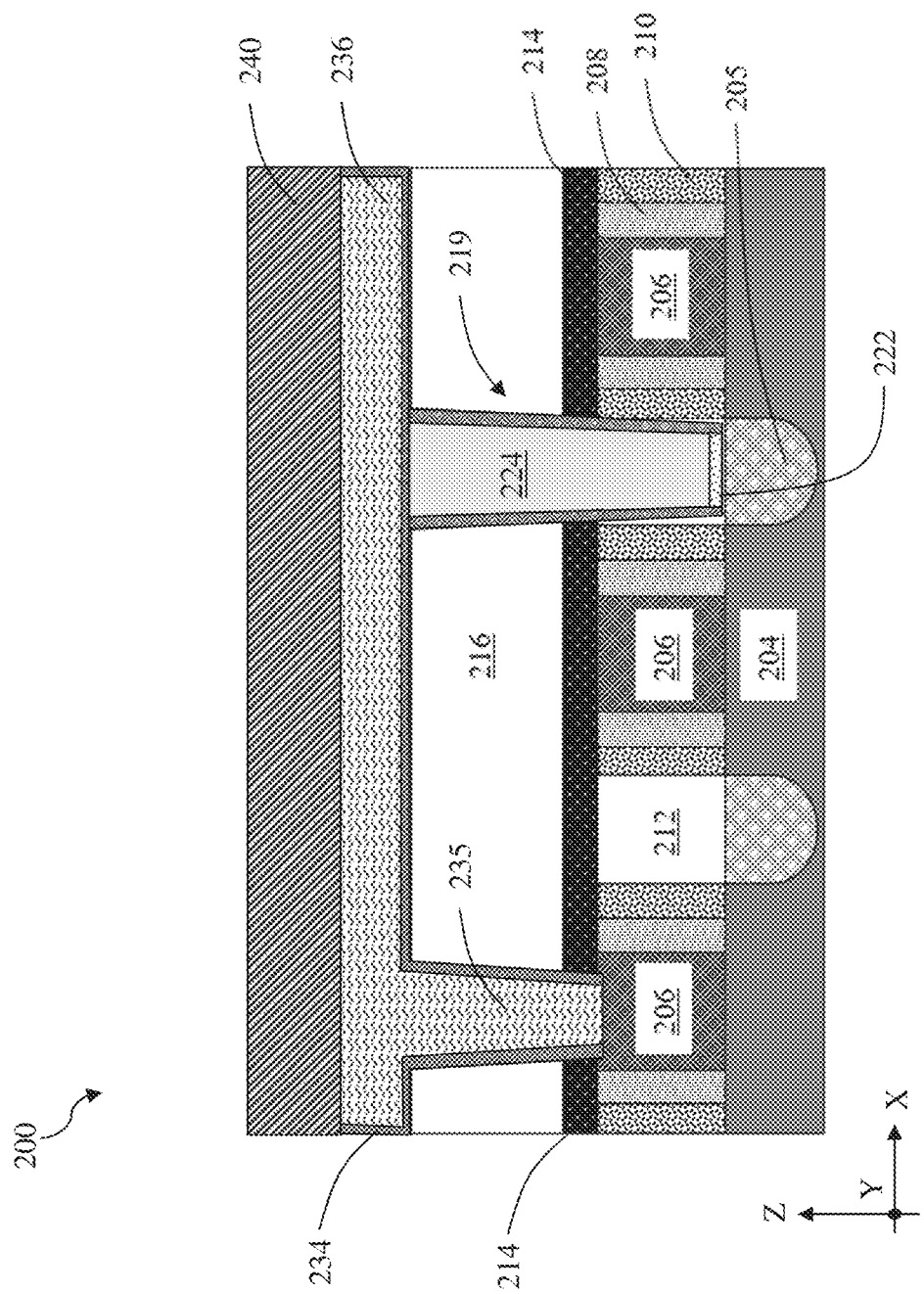

Referring to FIGS. 1 and 10A, the method 100 includes a block 120 where a metal line 240 is formed in the third ILD layer 238 over the common rail line 236. In some embodiments, the metal line 240 may be formed of copper and may be formed using CVD, PVD, ELD, electroplating, or a suitable method. In some embodiments not separately shown in FIG. 10A, a barrier layer may be formed between the metal line 240 and the third ILD layer 238 that surrounds the metal line 240. The metal line 240 is part of the first metal layer and may be referred to as the first metal layer 240.

Referring to FIG. 1, the method 100 includes a block 122 where further processes are performed. Such further processes may include formation of further interconnect structures over the metal line 240. The further interconnect structures may include a plurality of dielectric layers, a plurality of metal layers, and a plurality of contact vias extending through each of the plurality of dielectric layers. The contact vias electrically connect adjacent metal layers. These interconnect structures and the first metal layer 240 may be collectively referred to as an MLI or an interconnect structure. The MLI functionally interconnect various active devices at the FEOL levels and passive devices that may be embedded in the MLI.

FIGS. 2-10 illustrate an example workpiece 200 where the gate contact 235 and the source/drain contact 219 are coupled to a gate structure and a source/drain feature that are to be grounded via the metal line 240 according to the design of the semiconductor device 200 to be fabricated from the workpiece 200. The illustration of the example workpiece 200 in FIGS. 2-10 does not in any way suggest that all gate structures or all source/drain features are to be grounded. In that regard, the gate structure 206 and the source/drain feature 205 that are electrically coupled to the metal line 240 may be referred to as to-be-grounded MEOL contacts. To implement embodiments of the present disclosure, the layout generation process for the semiconductor device 200 may include operations to determine how to group mergeable neighboring to-be-grounded MEOL contacts to jointly couple to a common rail line and then to the first metal layer. In some embodiments, all the mergeable to-be-grounded MEOL contacts are distributed along a straight line such that the common rail has a straight elongated shape to couple to all the mergeable to-be-grounded MEOL contacts. As long as more than one MEOL contacts may be jointly coupled to a common rail line (such as the common rail line 236), the common rail line may function to distribute current and reduce resistance by alleviating current crowding. That is, the lower limit of the length of a common rail line according to the present disclosure is the distance between two to-be-grounded MEOL contacts. As the purpose of a common rail line (such as the common rail line 236) is to electrically couple to the metal line 240, the length of the common rail line is bounded by the length of the metal line 240. In some embodiments, the metal line 240 is a straight line and has an elongated shape. In at least some embodiments, the metal line 240 may expand across the semiconductor device 200 and may be substantially coterminous with the substrate 202 of the semiconductor device. In some embodiments, the width of the common rail line 236 is smaller than the width of the metal line 240. The dimensions, ratios of dimensions, and overlapping between the common rail line 236 and the metal line 240 will be further discussed below.

Figure 10B:
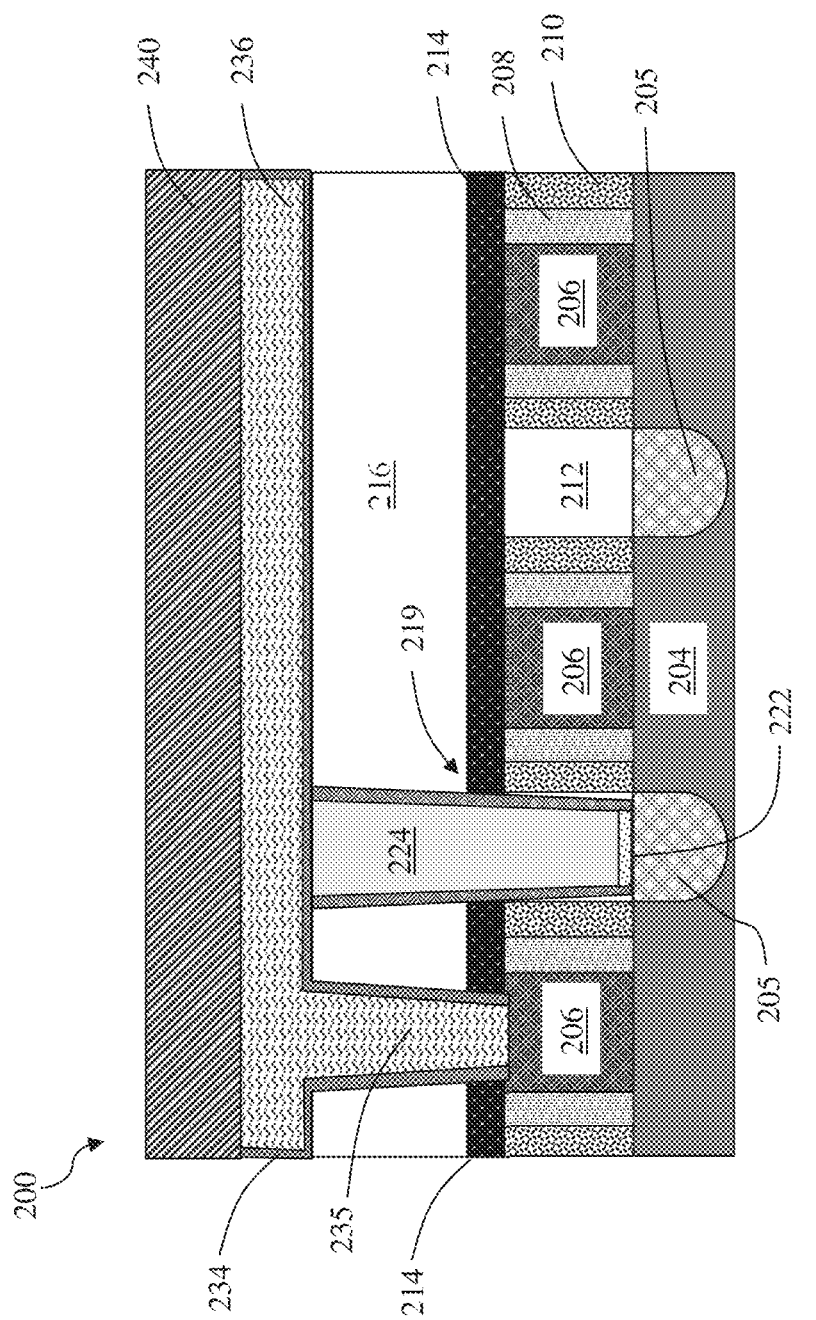
FIG. 10B is a fragmentary cross-sectional view different from that in FIG. 10A, according to aspects of the present disclosure.

Reference is now made to FIG. 10B. In some embodiments where the workpiece 200 includes a dummy or non-operational transistor, the source/drain contact 219 is formed over and electrically coupled to a source/drain region 205 that is adjacent to the gate structure 206 to which the gate contact 235 coupled. In those embodiments, the source/drain region 205 and the gate structure 206 are of the same transistor and are both electrically coupled to the common rail line 236 via the source/drain contact 219 and the gate contact 235, respectively. Dummy transistors may function as isolation structures between standard memory/logic cells. Dummy transistors may also be formed in less dense regions to reduce loading effect.

Figure 11:
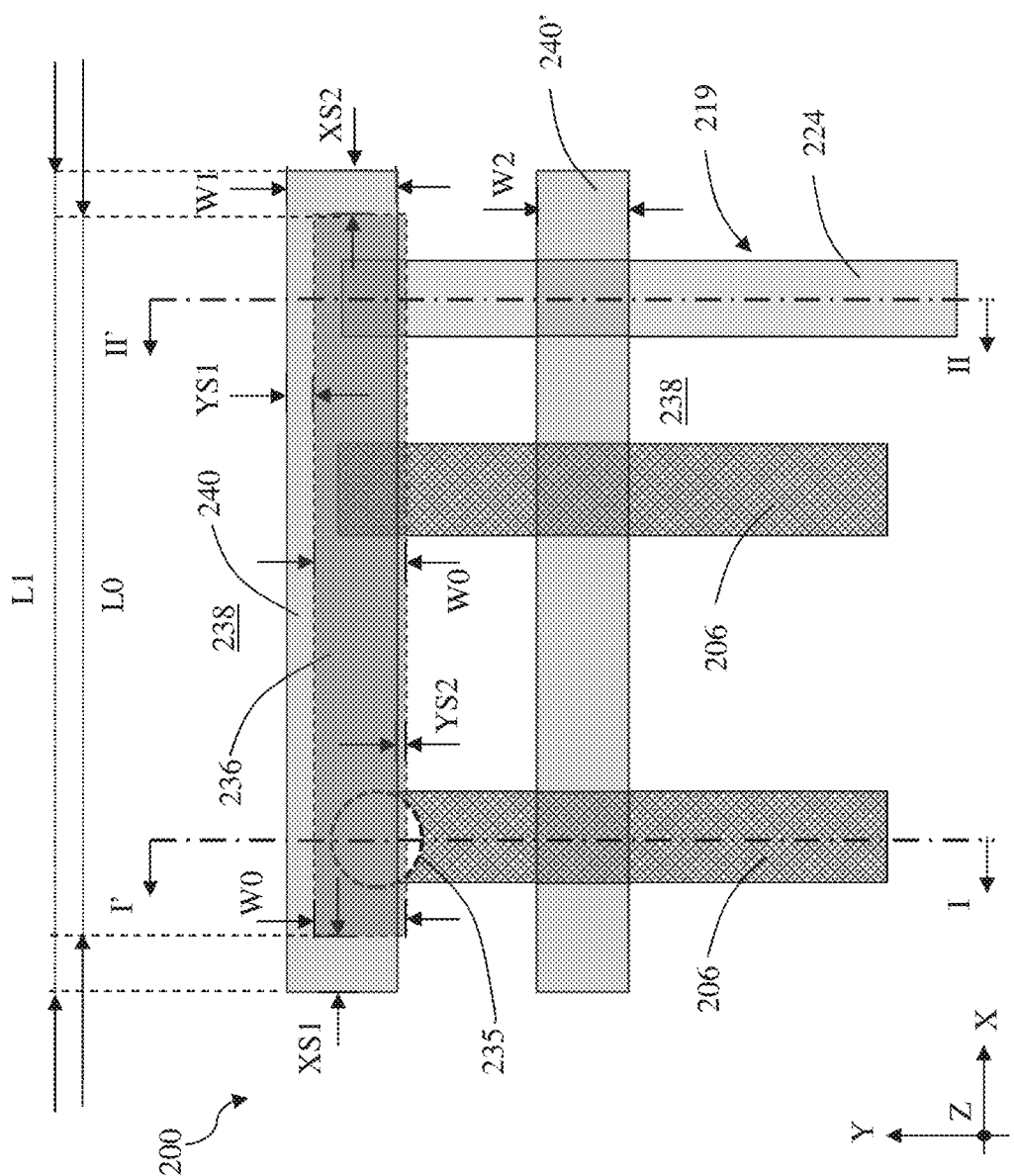
FIG. 11 is a schematic top view of the workpiece 200 in FIG. 10A according to various aspects of the present disclosure.

FIG. 11 is a schematic top view of the workpiece 200 in FIG. 10A. As shown in FIG. 11, the gate structure 206 on the right-hand side is electrically coupled to the common rail line 236 via the gate contact 235 and the source/drain feature 205 (shown in FIG. 10) is electrically coupled to the common rail line 236 via the source/drain contact 219. The common rail line 236 is electrically coupled to the metal line 240 for grounding. The gate structure 206 in the middle is not electrically coupled to the common rail line 236 as there is no gate contact connecting them. Besides the metal line 240, there is also another metal line 240', which is not coupled to the gate structure 206 and the source/drain contact 219. In embodiments represented in FIG. 11, the common rail line 236 has a length L0 along the X direction and a width W0 along the Y direction; the metal line 240 has a length L1 along the X direction and a width W1 along the Y direction; and the another metal line 240' has a width W2 along the Y direction. In some implementations, the metal line 240 is made longer and wider such that L1 is greater than L0 and W1 is greater than W0. L0 may be between 10 nm and 90 nm. In some instances, because the another metal line 240' is not designed to be electrically coupled to any common rail line, the another metal line 240' is not as wide as the metal line 240. That is, in these instances, W2 is smaller than W1. In some embodiments, W1 may be at least twice as wide as W2. In those embodiments, W1 may be between 20 nm and about 120 nm and W2 may be between about 10 nm and about 30 nm. In some alternative embodiments, the metal lines 240 and 240' have the same width. That is, W2 is equal to W1.

The metal line 240 may completely overlaps the common rail line 236 if a design rule governing the placement of the metal line 240 does not prevent the metal line 240 from being formed directly over the common rail line 236. In other embodiments, the design rule may dictate the placement of the metal line 240 such that it may cover about 50% and about 100% of the area of the common rail line 236. It has been observed that when the metal line 240 vertically overlaps less than 50% of the area of the common rail line 236, the improvement on the current crowding effect may not be sufficient to justify the additional cost associated with forming the common rail line 236. Here, the additional cost may include costs of additional masks and cost associated with increase process time (i.e. takt time). In some instances, along the X direction, the metal line 240 overhangs the common rail line 236 by an amount XS1 on the left-hand side and an amount XS2 on the right-hand side. Similarly, along the Y direction, the metal line 240 overhangs the common rail line 236 by an amount YS1 above the common rail line 236 and an amount YS2 below the common rail line 236. As shown in FIG. 11, each of the amounts XS1, XS2, YS1, and YS2 may be positive if the metal line 240 overhangs the common rail line 236 or negative if the common rail line 236 overhangs the metal line 240. In some instances, the absolute value of each of XS1 and XS 2 may be between about 0 nm and about 30 nm. In some implementations, YS1 is between about −10 nm and about 20 nm, and YS2 is between about −10 nm and about 15 nm. In some embodiments, XS1/L0 or XS2/L0 may be about ⅓ and YS1/W0 or YS2/W0 may be about ½. In some embodiments, YS1/W1 may be ⅛ and YS2/W1 may be 1/16.

Figure 12:
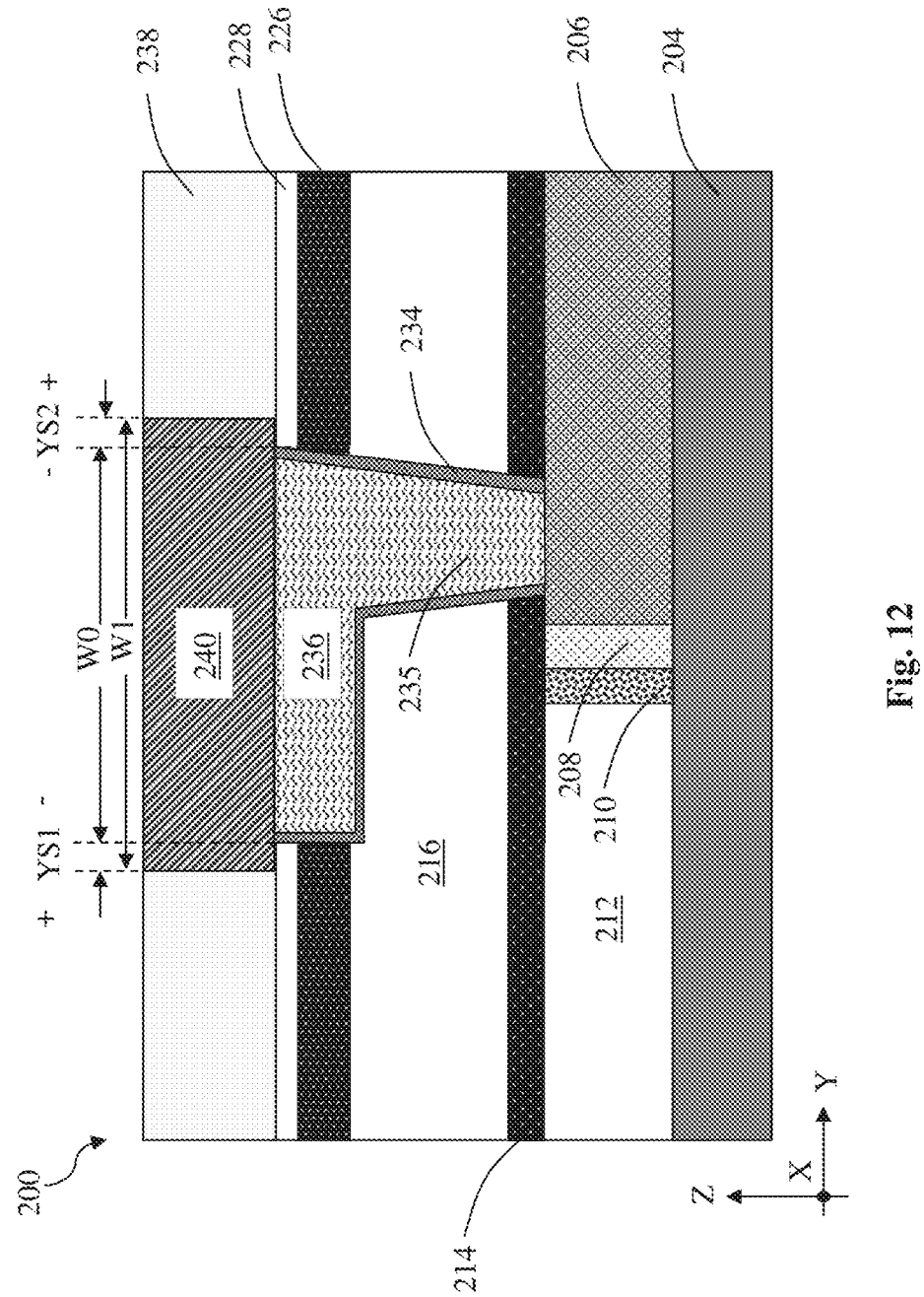
FIGS. 12 and 13A are fragmentary cross-sectional views of the contact structure in FIG. 11 along a second direction, according to various aspects of the present disclosure.
Figure 13A:
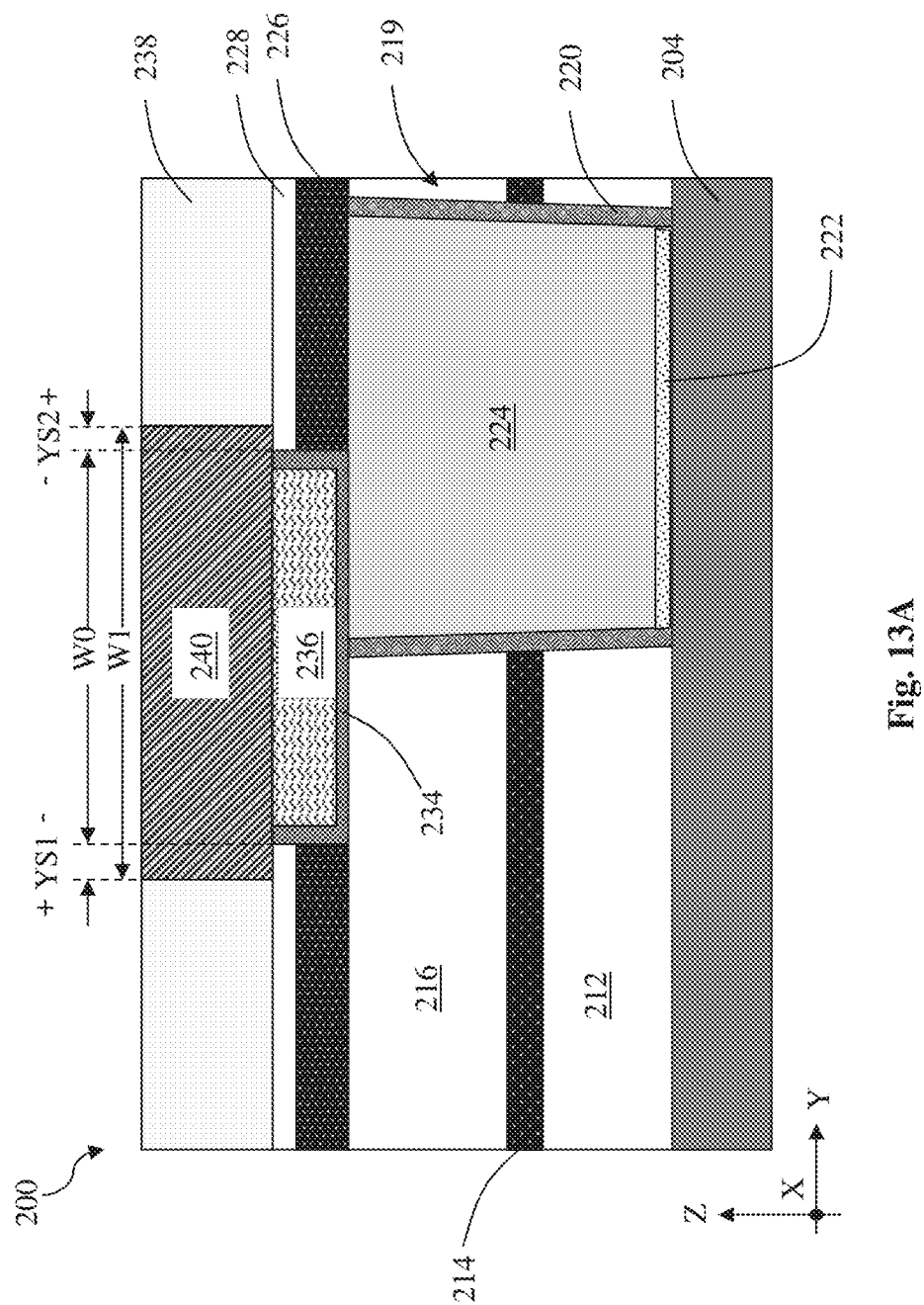

FIGS. 12 and 13A are fragmentary cross-sectional views of the contact structure in FIG. 11 along section I-I' and section II-II'. It can be seen from FIGS. 12 and 13A that while a gate contact (the gate contact 235) is still present, it merges with the common rail line 236. When the source/drain contact 219 is electrically coupled to the common rail line 236 for grounding, no source/drain contact via is needed. Conventionally, source/drain contact vias may be used to couple a to-be-grounded source/drain contact to the first metal layer. In those conventional technique, the source/drain contact via may be formed to have an oval or racetrack shape to enlarge contact area. It has been observed that the formation of oval and racetrack shaped contact via may introduce defects as the oval or racetrack shaped contact via may become too much elongated and cause shorting. For example, compared to formation of circular shaped contact via, the formation of oval and racetrack shaped contact via has a reduced critical dimension uniformity (CDU). In some instances, the CDU may be reduced by as much as about 30%. By doing away the oval or racetrack contact via, embodiments of the present disclosure may also improve performance, process window, and yield.

Figure 13B:
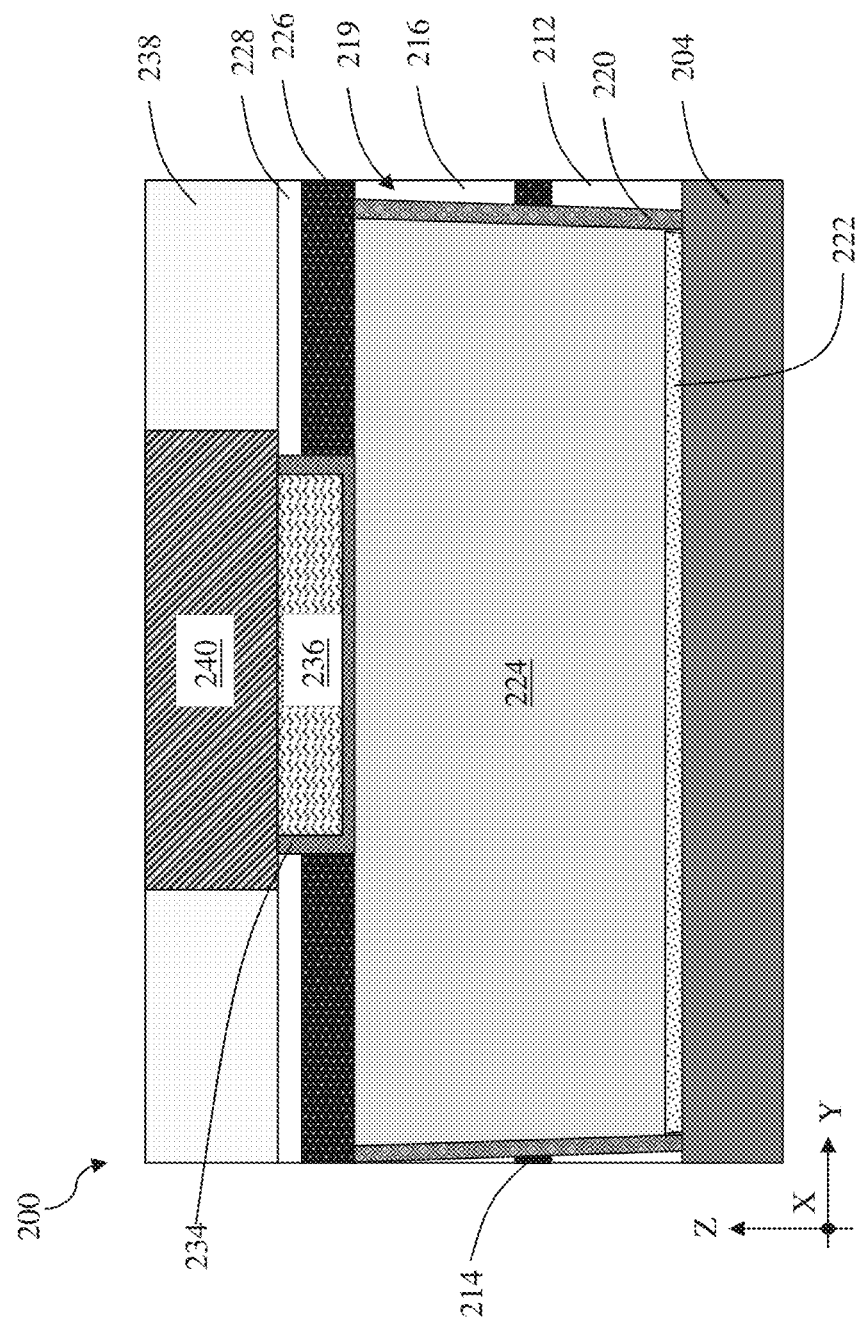
FIG. 13B is a fragmentary cross-sectional view different that in FIG. 13A, according to aspects of the present disclosure.

It is noted that section II-II' passes through a junction between the common rail line 236 and a terminal end of the source/drain contact 219 such that the common rail line 236 only extends partially over the source/drain contact 219 along the Y direction, as shown in FIG. 13A. In some other instances illustrated in FIG. 13B, the common rail line 236 may span across the source/drain contact 219 along the X direction such that the common rail line 236 extends completely over the source/drain contact 219 along the Y direction.

Figure 14:
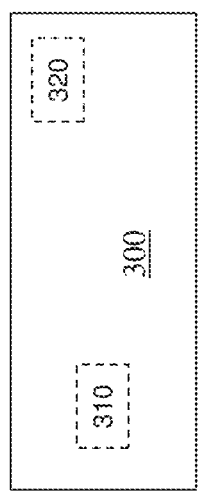
FIG. 14 is a schematic top view of a semiconductor device that includes more than one device regions, according to various aspects of the present disclosure.
Figure 15:
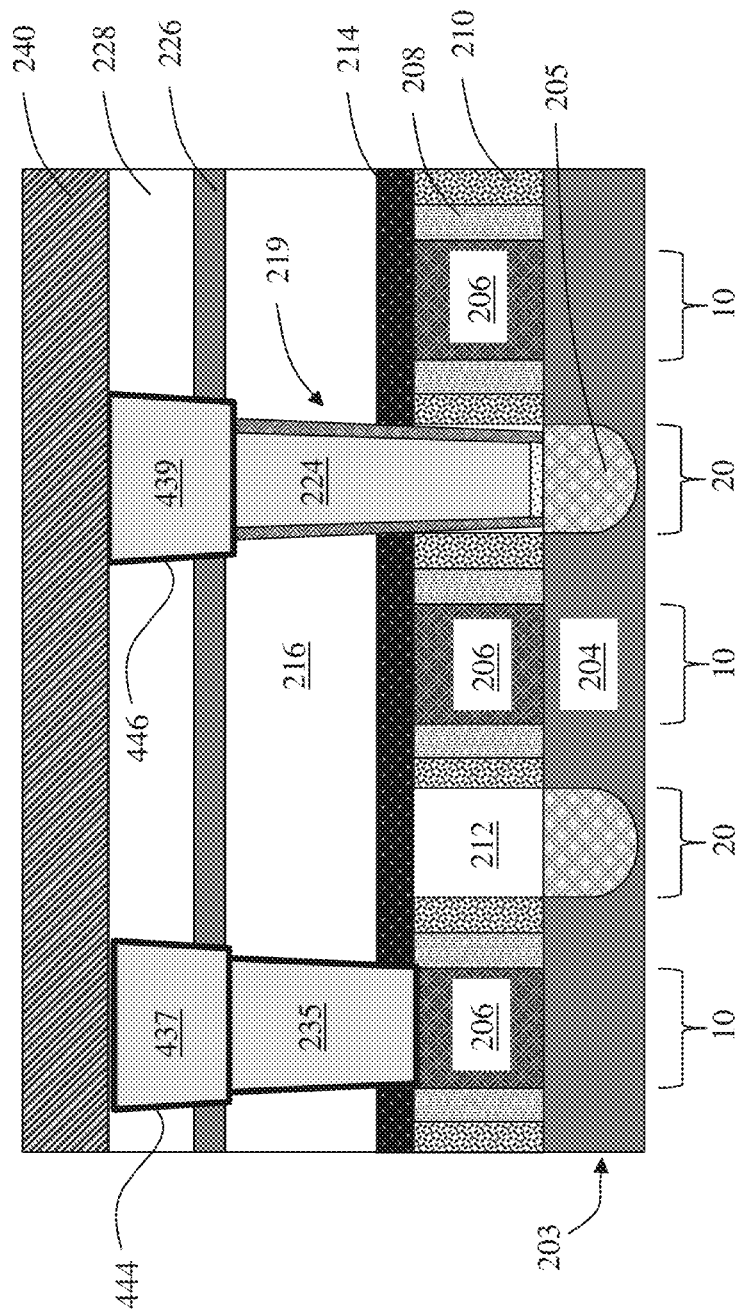
FIG. 15 is an alternative contact structure that is implemented in one of the device regions of the semiconductor device in FIG. 14, according to various aspects of the present disclosure.

Reference is now made to FIG. 14, where a semiconductor device 300 is schematically illustrated. In some embodiments, the semiconductor device 300 includes a plurality of device regions with different feature dimensions. As illustrated in FIG. 14, the semiconductor device 300 includes at least a first device region 310 and a second device region 320 different and distinct from the first device region 310. In some embodiments, the contact structure illustrated in FIGS. 10A, 10B, 11, 12, 13A, and 13B is implemented in the first device region 310 but not in the second device region 320 and a contact structure illustrated in FIG. 15 is implemented in the second device region 320 but not in the first device region 310. In some embodiments, a critical dimension of a source/drain contact in the first device region is smaller than a critical dimension of a source/drain contact in the second device region 320. An example of the critical dimension may be a width or a diameter of a top surface of the source/drain contact.

In some instances, the first device region 310 and the second device region 320 serve different functions. For example, the first device region 310 may be a memory device region and the second device region 320 may be logic device region. For another example, the first device region 310 may be a logic device region and the second device region 320 may be an input/output device region. A memory device region may include memory cells, such as static random access memory (SRAM) cells, a dynamic RAM (DRAM) cells, a resistive RAM (RRAM) cells, a magnetoresistive RAM (MRAM) cells, read only memory (ROM) cells, or the like. A logic device region may include logic gate cells, such as AND, OR, NAND, NOR, XOR, INV, AND-OR-Invert (AOI), OR-AND-Invert (OAI), MUX, Flip-flop, BUFF, Latch, delay, clock cells or the like.

As described below, this selective implementation of the contact structure in FIGS. 10A, 10B, 11, 12, 13A, and 13B provides advantages. It has been observed that the current crowding effect impacts the source/drain contact more than it does the gate contact because only small gate leakage current is to conduct through the gate contact. As a voltage drop is calculated as a product of current and resistance, a small gate leakage current is likely to result in a small voltage drop. In contrast, the current through source/drain region is much greater and may result in a more significant voltage drop. It has also been observed that when a dimension or a diameter of a top surface of a source/drain contact (such as the source/drain contact 219) is less than about 27~33 nm (including 30 nm), benefits associated with implementation of the contact structure in FIGS. 10A, 10B, 11, 12, 13A, and 13B, such as reduction of current crowding effect, outweighs additional cost associated with that contact structure. Such additional cost includes cost of any additional masks in the fabrication process and cost due to prolonged takt time (i.e. process time). Conversely, when a dimension of a top surface of a source/drain contact (such as the source/drain contact 219) is greater than about 27~33 nm (including 30 nm), the current crowding effect is less pronounced and the additional cost associated with that contact structure may outweigh its benefits. By selectively implementing the contact structure in FIGS. 10A, 10B, 11, 12, 13A, and 13B in device regions where benefits outweigh costs, no undue cost would be devoted to structures that bring little or no benefits.

Reference is now made to FIG. 15. In the second device region 320 where the contact structure in FIGS. 10A, 10B, 11, 12, 13A, and 13B is not implemented, the contact structure in FIG. 15 is implemented. In the contact structure in FIG. 15, the gate contact 235 is electrically coupled to the metal line 240 via a gate contact via 437 and the source/drain contact 219 is electrically coupled to the metal line 240 via a source/drain contact via 439. In some embodiments shown in FIG. 15, the gate contact via 437 and the source/drain contact via 439 are formed through the CESL 226 and the second ILD layer 228. The gate contact via 437 may include a second barrier layer 444 and the source/drain contact via 439 may include a third barrier layer 446. In some embodiments, both the second barrier layer 444 and the third barrier layer 446 may be formed of tantalum, tantalum nitride, tantalum carbide, titanium, titanium nitride, titanium carbide, and other suitable material that can block oxygen diffusion or metal diffusion into neighboring dielectric layers. The second and third barrier layers 444 and 446 may be deposited using atomic layer deposition (ALD), chemical vapor deposition (CVD), or electroless deposition (ELD) and may be formed to a thickness between about 0.5 nm and about 5 nm. The metal fill layer for the gate contact via 437 and the source/drain contact via 439 may be formed of any suitable conductive material, such as tungsten, nickel, tantalum, titanium, aluminum, copper, cobalt, tantalum nitride, titanium nitride, ruthenium, and/or other suitable conductive materials. As compared to the contact structure illustrated in FIGS. 10A, 10B, 11, 12, 13A, and 13B, the contact structure in FIG. 15 does not include any structure that corresponds to the common rail line 236 that are electrically coupled to a plurality of mergeable to-be-grounded MEOL contacts.

The contact structures and method disclosed herein provide several benefits. In some embodiments, the contact structure of the present disclosure includes a common rail line that is electrically coupled to mergeable to-be-grounded MEOL features. The common rail may extend parallel to the first metal layer and largely increase the contact area with the first metal layer. The common rail lines may help distribute current evenly and alleviate the current crowding effect, resulting in reduction of resistance between the MEOL contacts and the first metal layer.

The present disclosure provides for many different embodiments. In one embodiment, a contact structure of a semiconductor device is provided. The contact structure includes a gate contact in contact with a gate structure and extending through a first dielectric layer, a source/drain contact in contact with a source/drain feature and extending through the first dielectric layer, a common rail line in contact with the gate contact and the source/drain contact, and a power rail line in contact with the common rail line and electrically coupled to a ground of the semiconductor device.

In some embodiments, the gate contact, the source/drain contact, and the common rail line includes tungsten, ruthenium, nickel, or cobalt. In some embodiments, the power rail line includes copper. In some implementations, the power rail line includes a first length (L1) along a lengthwise direction, the common rail line extends between the gate contact and the source/drain contact along the lengthwise direction and includes a second length (L2) along the lengthwise direction, and the second length (L2) is smaller than the first length (L1). In some instances, the common rail line includes a first width (W1) along a widthwise direction perpendicular to the lengthwise direction, the common rail line includes a second width (W2) along the widthwise direction, and the first width (W1) is equal to or greater than the second width (W2). In some implementations, the power rail line is disposed directly over and overlaps the common rail line. In some instances, the common rail line includes an elongated rectangular shape. In some embodiments, the contact structure is free of contact vias between the gate contact and the source/drain contact, one the one hand, and the power rail line, on the other hand.

In another embodiment, a contact structure of a semiconductor device is provided. The contact structure includes a first dielectric layer over a gate structure and a source/drain feature, a contact etch stop layer over the first dielectric layer, a source/drain contact in contact with the source/drain feature, the source/drain contact extending through the first dielectric layer and having a top surface below the contact etch stop layer, a gate contact in contact with the gate structure, a common rail line in contact with the gate contact and the source/drain contact, the common rail line extending through the contact etch stop layer and having a top surface rising above the contact etch stop layer, and a power rail line disposed directly above and in contact with the common rail line, wherein the power rail line is grounded.

In some embodiments, a first length (L1) of the power rail line extends along a first direction, a second length (L2) of the common rail line extends along the first direction, the semiconductor device further includes a plurality of gate structures and a plurality of source/drain feature to be grounded, a plurality of gate contacts are in contact with the plurality of gate structures, respectively, and are aligned along the first direction, a plurality of source/drain contacts are in contact with the plurality of the source/drain feature and are aligned along the first direction, and the plurality of gate contacts and plurality of source/drain contacts are in contact with the common rail line. In some embodiments, the first length (L1) is greater than the second length (L2). In some embodiments, a first width (W1) of the power rail line extends along a second direction perpendicular to the first direction, a second width (W2) of the common rail line extends along the second direction, and the first width (W1) is greater than the second width (W2). In some instances, the gate contact, the source/drain contact, and the common rail line include tungsten, ruthenium, nickel, or cobalt, and the power rail line includes copper.

In still another embodiment, a method is provided. The method includes depositing a first dielectric layer over a gate structure and a source/drain feature in a workpiece, forming a source/drain contact opening through the first dielectric layer to expose a portion of the source/drain feature, forming a source/drain contact in the source/drain contact opening, depositing a contact etch stop layer over a top surface of the workpiece and a top surface of the source/drain contact, depositing a second dielectric layer over the contact etch stop layer, forming a gate contact opening through the first dielectric layer, the contact etch stop layer and the second dielectric layer to expose the gate structure, forming a common rail opening in fluid communication with the gate contact opening and to expose the top surface of the source/drain contact, forming a gate contact in the gate contact opening, forming a common rail line in the common rail opening, and forming a power rail line over and in contact with the common rail line.

In some embodiments, the forming of the common rail line in the common rail opening includes electrically coupling the gate contact and the source/drain contact. In some embodiments, the method further includes depositing a barrier layer over surfaces of the gate contact opening and the common rail opening, and anisotropically recessing the deposited barrier layer to expose a top surface of the gate structure. In some embodiments, a first deposition process is used for the forming of the gate contact in the gate contact opening and a second deposition process is used for the forming of the common rail line in the common rail opening, and the first deposition process is different from the second deposition process. In some implementations, a single process is used for the forming of the gate contact in the gate contact opening and the forming of the common rail line in the common rail opening. In some instances, the forming of the gate contact in the gate contact opening includes forming the gate contact in a bottom-up fashion using a precursor having an affinity to the gate structure. In some embodiments, the forming of the gate contact includes depositing tungsten, ruthenium, nickel, or cobalt in the gate contact opening, the forming of the common rail line includes depositing tungsten, ruthenium, nickel, or cobalt in the common rail opening, and the forming of the power rail line includes forming the power rail line using copper.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A contact structure of a semiconductor device, comprising:
    a gate contact in contact with a gate structure and extending through a first dielectric layer;
    a source/drain contact in contact with a source/drain feature and extending through the first dielectric layer;
    a common rail line disposed over and electrically coupled to the gate contact and the source/drain contact;
    a barrier layer extending continuously from between the gate contact and the first dielectric layer to between a bottom surface of the common rail line and source/drain contact; and
    a power rail line in contact with the common rail line and electrically coupled to a ground of the semiconductor device.

2. The contact structure of claim 1, wherein the gate contact, the source/drain contact, and the common rail line comprise tungsten, ruthenium, nickel, or cobalt.

3. The contact structure of claim 1, wherein the power rail line comprises copper.

4. The contact structure of claim 1,
    wherein the power rail line includes a first length (L1) along a lengthwise direction,
    wherein the common rail line extends between the gate contact and the source/drain contact along the lengthwise direction and includes a second length (L2) along the lengthwise direction, wherein the second length (L2) is smaller than the first length (L1).

5. The contact structure of claim 4,
wherein the common rail line includes a first width (W1) along a widthwise direction perpendicular to the lengthwise direction,
wherein the common rail line includes a second width (W2) along the widthwise direction,
wherein the first width (W1) is equal to or greater than the second width (W2).

6. The contact structure of claim 1, wherein the power rail line is disposed directly over and overlaps the common rail line.

7. The contact structure of claim 1, wherein the common rail line includes an elongated rectangular shape.

8. The contact structure of claim 1 is free of contact vias between the gate contact and the source/drain contact, on the one hand, and the power rail line, on the other hand.

9. A contact structure of a semiconductor device, comprising:
a first dielectric layer over a gate structure and a source/drain feature;
a contact etch stop layer over the first dielectric layer;
a source/drain contact in contact with the source/drain feature, the source/drain contact extending through the first dielectric layer and having a top surface below the contact etch stop layer;
a gate contact in contact with the gate structure;
a common rail line in contact with the gate contact and the source/drain contact, the common rail line extending through the contact etch stop layer and having a top surface rising above the contact etch stop layer; and
a power rail line disposed directly above and in contact with the common rail line, wherein the power rail line is grounded.

10. The contact structure of claim 9,
wherein a first length (L1) of the power rail line extends along a first direction,
wherein a second length (L2) of the common rail line extends along the first direction,
wherein the semiconductor device further comprises a plurality of gate structures and a plurality of source/drain feature to be grounded,
wherein a plurality of gate contacts are in contact with the plurality of gate structures, respectively, and are aligned along the first direction,
wherein a plurality of source/drain contacts are in contact with the plurality of the source/drain feature and are aligned along the first direction,
wherein the plurality of gate contacts and plurality of source/drain contacts are in contact with the common rail line.

11. The contact structure of claim 10, wherein the first length (L1) is greater than the second length (L2).

12. The contact structure of claim 10,
wherein a first width (W1) of the power rail line extends along a second direction perpendicular to the first direction,
wherein a second width (W2) of the common rail line extends along the second direction,
wherein the first width (W1) is greater than the second width (W2).

13. The contact structure of claim 9,
wherein the gate contact, the source/drain contact, and the common rail line comprise tungsten, ruthenium, nickel, or cobalt,
wherein the power rail line comprises copper.

14. A semiconductor structure, comprising:
a fin structure including a channel region and a source/drain region adjacent the channel region;
a gate structure disposed over the channel region;
a source/drain feature disposed over the source/drain region;
a first dielectric layer disposed over the gate structure and the source/drain feature;
a gate contact extending through the first dielectric layer and in direct contact with the gate structure;
a source/drain contact extending through the first dielectric layer and in direct contact with the source/drain feature;
a common rail line disposed over the gate contact, the source/drain contact, and the first dielectric layer, the common rail line extending along a first direction;
an etch stop layer disposed over the first dielectric layer; and
a second dielectric layer over the etch stop layer,
wherein the gate contact and the common rail line are one-piece with a uniform composition,
wherein the common rail line is disposed in the etch stop layer and the second dielectric layer.

15. The semiconductor structure of claim 14, further comprising a barrier layer extending continuously from between the gate contact and the first dielectric layer to between a bottom surface of the common rail line and the first dielectric layer.

16. The semiconductor structure of claim 15, wherein the barrier layer extends continuously from between the bottom surface of the common rail line and the first dielectric layer to between the common rail line and the second dielectric layer.

17. The semiconductor structure of claim 15, wherein the source/drain contact is spaced apart from the common rail line by the barrier layer.

18. The semiconductor structure of claim 14, further comprising:
a metal line disposed over the common rail line and extending lengthwise along the first direction.

19. The semiconductor structure of claim 18, wherein the metal line overhangs the common rail line along a second direction perpendicular to the first direction.

20. The semiconductor structure of claim 18, further comprising:
another gate structure disposed between the gate structure and the source/drain contact.

* * * * *